United States Patent

Murata et al.

[11] Patent Number: 5,603,158
[45] Date of Patent: Feb. 18, 1997

[54] METHOD FOR PRODUCING FLEXIBLE CIRCUIT BOARDS

[75] Inventors: Katsuhiro Murata, Ohtsu; Mitsumasa Shibata; Toru Hatakeyama, both of Kusatsu; Tadaaki Isono, Ohtsu, all of Japan

[73] Assignee: Nippon Graphite Industries Ltd., Ohtsu, Japan

[21] Appl. No.: 554,484

[22] Filed: Nov. 7, 1995

Related U.S. Application Data

[62] Division of Ser. No. 264,781, Jun. 23, 1994, Pat. No. 5,493,074.

[30] Foreign Application Priority Data

Sep. 3, 1993 [JP] Japan .................................. 5-220043

[51] Int. Cl.⁶ ...................................................... H05K 3/02
[52] U.S. Cl. ............................ 29/846; 156/150; 156/151; 427/96; 216/48; 216/52
[58] Field of Search ................................ 29/846; 427/96, 427/97; 156/150, 151, 630, 633

[56] References Cited

U.S. PATENT DOCUMENTS

| | | | |
|---|---|---|---|
| 3,301,730 | 1/1967 | Spiwak et al. | 29/846 |
| 4,497,975 | 2/1985 | Selsing . | |
| 4,584,039 | 4/1986 | Shea | 29/846 X |
| 4,608,274 | 8/1986 | Wooten | 427/96 |
| 4,797,508 | 1/1989 | Chant | 29/846 X |
| 4,853,277 | 8/1989 | Chant | 427/96 X |
| 5,084,124 | 1/1992 | Taniguchi . | |
| 5,331,117 | 7/1994 | Bryant . | |
| 5,334,421 | 8/1994 | McNutt . | |
| 5,369,881 | 12/1994 | Inaba et al. | 29/846 |

FOREIGN PATENT DOCUMENTS

| | | | |
|---|---|---|---|
| 1-152736 | 6/1989 | Japan | 427/96 |
| 1-152737 | 6/1989 | Japan | 427/96 |

*Primary Examiner*—Carl J. Arbes
*Attorney, Agent, or Firm*—Ladas & Parry

[57] ABSTRACT

An adhesive is applied onto a flexible resistive film 1 and dried to form an adhesive layer 2. A metal foil 3 is contacted onto the layer 2, which is subjected to a heat and pressing treatment. The foil 3 is polished. An ultraviolet light curable ink is applied on the foil 3 and dried to form a first layer 4. A negative film is placed on or over the layer 4 and ultraviolet light is irradiated thereto through the film so that the layer 4 is cured. Uncured portions of the layer 4 is removed so that cured portions thereof remain and the foil 3 is exposed between the remaining cured portions. The metal foil 3 is subjected to an etching treatment to remove exposed portions of the foil 3 so that unexposed portions of the foil 3 remain and form conductors 3A. The cured portions of the layer 4 is removed from the conductors 3A. A metal plating film 5 is formed on each conductor 3A to form each electrical conductive circuit 9. An ultraviolet light curable ink is applied on the layer 2 and dried to form a second layer 7. Ultraviolet light is irradiated to the layer 7 through the film 1 so that the layer 7 is cured in gaps 6 between the circuits 9. Uncured portions of the layer 7 is removed so that the circuits 9 are exposed and cured portions of the layer 7 remain in the gaps 6. The cured portions of the layer 7 is subjected to a heat treatment. The resulting flexible circuit board comprises the film 1, the adhesive layer 2, the circuits 9 and cured films 8 filling the gaps 6.

7 Claims, 2 Drawing Sheets

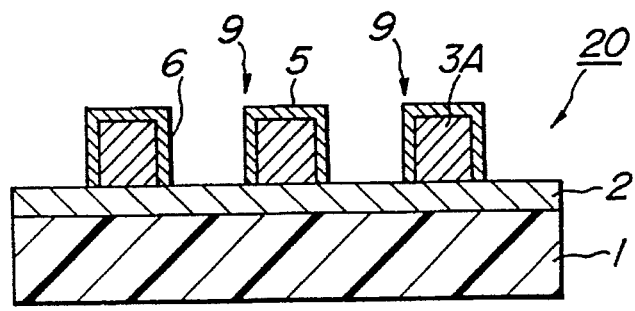
FIG_1
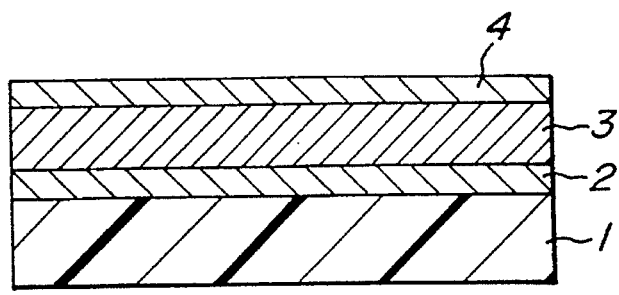
FIG_2a
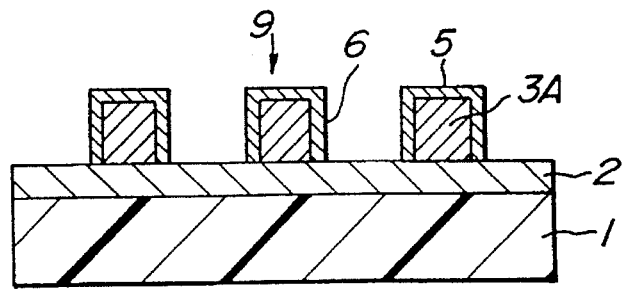
FIG_2b
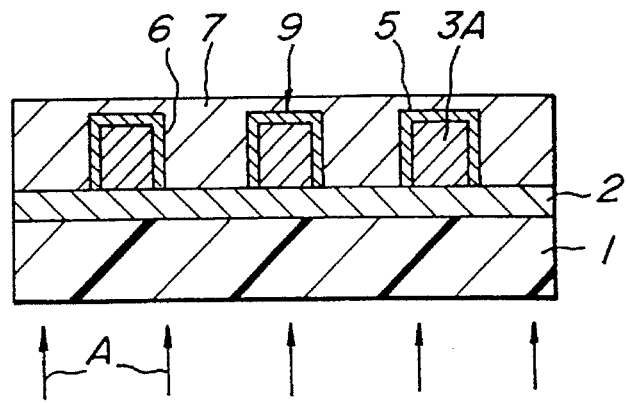
FIG_2c

FIG_3a
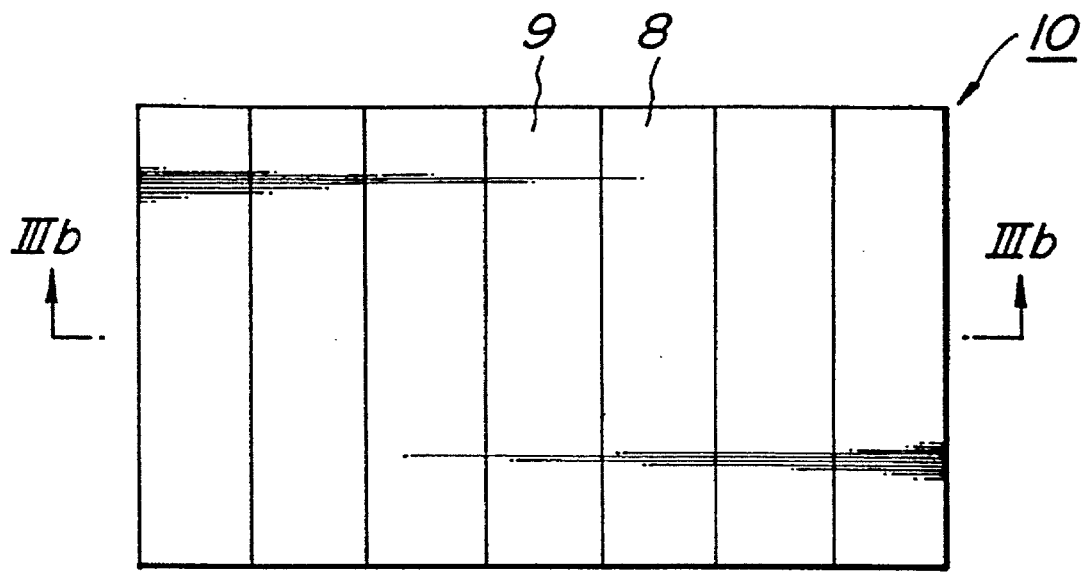
FIG_3b
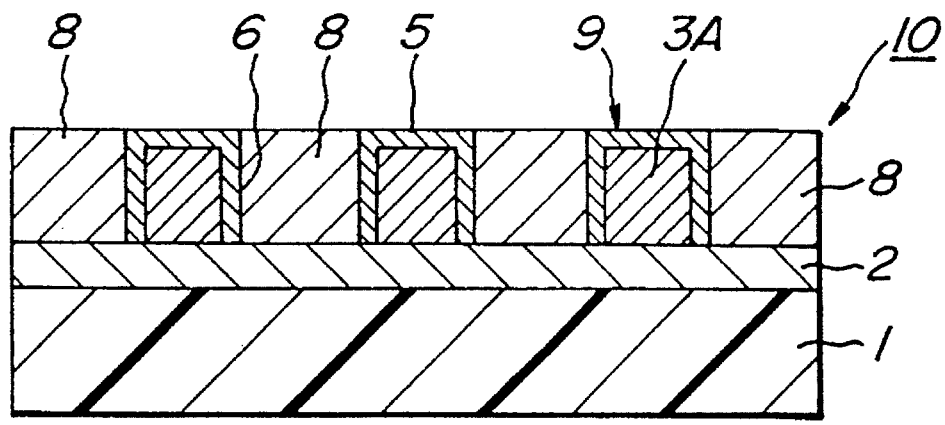

METHOD FOR PRODUCING FLEXIBLE CIRCUIT BOARDS

This is a divisional of Ser. No. 08/264,781, filed on Jun. 23, 1994, now U.S. Pat. No. 5,493,074.

BACKGROUND OF THE INVENTION

1. Field of the Invention

The present invention relates to flexible circuit boards and a method for producing the same. Such boards are widely used as connecting devices in electronic devices such as liquid crystal display tubes, ECD and solar cells for mechanically and electrically connecting electrode portions of the electronic devices and of a print circuit board.

2. Description of the Related Art

Recently, flexible circuit boards have been used in electronic devices such as liquid crystal display tubes, ECD and solar cells for mechanically and electrically connecting electrode portions of the electronic devices and a print circuit board. So called anisotropic conductive membrane devices have been widely used for connecting the flexible circuit boards. The anisotropic conductive membrane device is made of a hot melt adhesive containing conductive fine particles. FIG. 1 is a cross sectional view schematically showing an example of such flexible circuit board 20. An adhesive layer 2 is formed on a flexible resistive film 1 and electrical conductive layers 9 are formed on the adhesive layer 2. Each electrical conductive layer 9 is consisting of a conductor 3A of the metal foil having a predetermined pattern and a metal plating layer 5 covering the surface of the conductor 3A. When producing such flexible circuit board 20, a metal foil is adhered to the flexible resistive film 1 with an appropriate adhesive and then processed according to a photoresist technique to provide each conductor 3A with a predetermined pattern as shown in FIG. 1, which is then covered with the metal plating layer 5 to provide each electrical conductive layer 9.

Therefore, as shown in FIG. 1, which is a cross sectional view of the flexible circuit board 20, the electrical conductive circuits 9 are formed as protruding portions and gaps 6 are left between the electrical conductive circuits 9. However, when the electrode portions of the print circuit board and/or the electronic devices and terminal portions of the flexible circuit board 20 are mechanically and electrically connected by means of the hot melt adhesive, adhesive strengths between the electrode portions and the terminal portions are occasionally lowered, because the gaps 6 are formed in the surface of the flexible circuit board 20. Moreover, the conductive fine particles in the anisotropic conductive membrane device occasionally flow into the gaps 6 and electrical resistances between the electrode portions and the terminal portions are increased.

SUMMARY OF THE INVENTION

It is an object of the invention to provide a flexible circuit board wherein adhesive strengths between electrode portions of a print circuit board and/or an electronic device and terminal portions of the flexible circuit board may be improved.

It is another object of the invention to prevent that electrical resistances between the electrode portions and the terminal portions are increased.

The present invention provides a flexible circuit board comprising: a flexible resistive film; an adhesive layer formed on said flexible resistive film; electrical conductive circuits being formed on said adhesive layer, each electrical conductive circuit comprising a conductor of a metal foil and a metal plating film covering the surface of said conductor; and cured films filling gaps formed between said electrical conductive circuits, said cured films being composed of a cured product of an ultraviolet light curable ink.

The present invention also provides a process for producing a flexible circuit board comprising the steps of:

(A) applying an adhesive onto a flexible resistive film and drying the adhesive to form an adhesive layer;

(B) contacting a metal foil onto said adhesive layer, which is subjected to a heat and pressing treatment so that said flexible resistive film and said metal foil are adhered to each other;

(C) polishing a surface of said metal foil to obtain a polished surface, onto which an ultraviolet light curable ink is applied and dried to form a first layer composed of said ink;

(D) placing a negative film with a predetermined pattern on or over said first layer and irradiating ultraviolet light to said first layer through said negative film so that said first layer is cured according to said predetermined pattern of said negative film;

(E) removing uncured portions of said first layer in the stage (D) so that cured portions of said first layer remain according to said predetermined pattern and said metal foil is exposed between said remaining cured portions;

(F) subjecting said metal foil to an etching treatment to remove exposed portions of said metal foil between said cured portions so that unexposed portions of said metal foil remain to form conductors;

(G) removing said cured portions of said first layer from said conductor;

(H) forming a metal plating film on each conductor to form each electrical conductive circuit comprising said conductor and said metal plating film covering the surface of said conductor;

(I) applying an ultraviolet light curable ink on said adhesive layer and drying said ink to form a second layer;

(J) irradiating ultraviolet light to said second layer through said flexible resistive film so that said second layer is cured by the ultraviolet light in gaps between said electrical conductive circuits;

(K) removing uncured portions of said second layer so that said electrical conductive circuits are exposed and cured portions of said second layer remain in said gaps;

(L) subjecting said cured portions of said second layer to a heat treatment.

According to the flexible circuit board of the present invention, each gap formed between the electrical conductive circuits is filled with a cured film composed of a cured product of an ultraviolet light curable ink. Therefore, in a cross sectional view of the flexible circuit board as shown in FIG. 2, the gaps between the circuits are filled with the cured films and the circuits are not protruded from the cured films. In other words, a flat surface is formed by filling the gaps with the cured films.

Therefore, when electrode portions of a print circuit board and/or an electronic device and terminal portions of the flexible circuit board are mechanically and electrically connected by means of a hot melt adhesive, it is possible to avoid the lowering of adhesive strengths between the electrode portions and the terminal portions and to maintain them over a predetermined value in a practical manufacturing process, because the gaps are filled with the cured films to form the flat surface. Moreover, it is possible to prevent that conductive fine particles in an anisotropic conductive membrane device flow into the gaps to increase an electrical resistance between the electrode portions and the terminal portions.

According to the process for producing a flexible circuit board of the present invention, after forming the electrical conductive circuits, the ultraviolet light curable ink is applied on the adhesive layer and dried to form the second layer, to which ultraviolet light is irradiated through the flexible resistive film so that the second layer is cured by the ultraviolet light in gaps between the circuits, and then the uncured portion of the second layer is removed so that the circuits are exposed. After these stages, the gaps formed between the circuits are filled with the cured film composed of the cured product of the ink.

As a result, it is possible to fill the gaps inevitably formed between the circuits with the cured films so that the circuits are not protruded from the cured films and a flat surface is formed. Moreover, these stages may be easily carried out by applying and modifying prior photoresist techniques and facilities without introducing new facilities. Therefore, the present invention is extremely useful in the art and may be widely used in various electronic devices such as liquid crystal display tubes, ECD's, solar cells or the like, which are used in various electrical and electronic instruments such as word processors, watches, cameras and various display devices.

BRIEF DESCRIPTION OF THE DRAWINGS

FIG. 1 is a cross sectional view schematically showing a prior flexible circuit board 20, wherein an adhesive layer 2 is formed on a flexible resistive film 1 and electrical conductive circuits 9 are formed on the adhesive layer 2;

FIG. 2(a) is a cross sectional view schematically showing a first layer 4 composed of an ultraviolet light curable ink formed on a metal foil 3;

FIG. 2(b) is a cross sectional view schematically showing electrical conductive circuits 9 comprising conductors 3A and metal plating films 5 covering the surfaces of the conductors 3A;

FIG. 2(c) is a cross sectional view schematically showing a second layer 7 composed of an ultraviolet light curable ink formed on the adhesive layer 2;

FIG. 3(a) is a plain view schematically showing a flexible circuit board 10 according to the present invention;

FIG. 3(b) is a cross sectional view schematically showing the flexible circuit board 10.

DESCRIPTION OF THE PREFERRED EMBODIMENTS

A flexible circuit board 10 according to the preferred embodiment of the invention and its manufacturing process will now be explained below referring to FIGS. 2 and 3. First, in the stage (A), an adhesive is applied onto a flexible resistive film 1 and dried to form an adhesive layer 2 as shown in FIG. 2(a). The flexible resistive film 1 may preferably made of a resin selected from a group consisting of a polyester resin, a polyimide resin, a polyetherimide resin, a polycarbonate resin and an aramide (aromatic amide) resin.

The adhesive may preferably be an epoxy adhesive. A thickness of an applied layer of the adhesive before drying may preferably be 5.0 to 30.0 μm. When the thickness is below 5.0 μm, an adhesive strength of the adhesive layer is not enough. When the thickness is more than 30.0 μm, flexibility of the resulting flexible circuit board may be lost to degrade reliability of connection between the electrode portions and the terminal portions of the flexible circuit board. The adhesive layer may be dried using a far infrared ray furnace.

In the stage (B), a metal foil 3 is contacted onto the adhesive layer 2, which is subjected to a heat and pressing treatment so that the flexible resistive film 1 and the metal foil 3 are adhered to each other. A thickness of the metal foil 3 may preferably be 4 to 70 μm. The heat and pressing treatment may be carried out in a temperature of 100° C. to 150° C. and in a pressure of 1 to 5 kg/cm. After the flexible resistive film 1 and the metal foil 3 are adhered to each other, the adhesive layer 2 may preferably be aftercured in a temperature of 80° C. to 180° C. for 1 to 24 hours in a hot-blast stove.

Then, in the stage (C), a surface of the metal foil 3 is polished to obtain a polished surface, onto which an ultraviolet light curable ink is applied and dried to form a first layer 4 composed of an ultraviolet light curable ink as shown in FIG. 2(a). The ink may preferably be a photoetching resist ink comprising a photosensitive acrylic polymer (such as polyacrylic ester) or a photosensitive epoxy polymer as its main component. An apparent specific gravity of the ultraviolet light curable ink may preferably be 0.9 to 2.0 and a viscosity thereof may preferably be 0.1 to 1000 poise.

A thickness of the applied layer of the ink before drying may preferably be 5 to 20 μm. When the thickness is below 5 μm, resistance of the applied layer against bending is degraded. When the thickness is over 20 μm, it is rather difficult to expose ultraviolet light over the whole thickness of the applied layer so that a resolving power of the ink is degraded in the following developing process. The applied layer of the ink may preferably be dried in a temperature of 40° to 100° C. for 3 minutes to 6 hours.

In the stage (D), a negative film with a predetermined pattern is placed on or over the first layer 4 and ultraviolet light is irradiated to the first layer 4 through the negative film so that the first layer 4 is cured in regions ultraviolet light pass through the negative film. Such regions are decided according to the predetermined pattern of the negative film.

In the stage (E), uncured portions of the first layer 4 in the stage (D) are removed by using a developing solution so that cured portions of the first layer 4 remain according to the predetermined pattern and the metal foil 3 are exposed between the remaining cured portions. A pattern of the remaining cured portions of the first layer 4 provides a pattern of electrical conductive circuits in the following stages. Then, the remaining cured portions may preferably be dried in a temperature of 30° to 100° C.

In the stage (F), the metal foil 3 is subjected to an etching treatment to remove the exposed portions of the metal foil 3 between the cured portions so that unexposed portions 3A (as shown in FIG. 2(b)) of the metal foil remain as conductors under the cured portions. Then, an etching solution may preferably be washed by water and the flexible resistive film 1 may preferably be dried in a temperature of 40° to 100° C.

In the stage (G), the cured portions of the first layer 4 are removed from the conductors 3A to expose surfaces thereof. The cured portions may preferably be washed by using a weak alkaline solution. The surfaces of the metal foils 3A may preferably be subjected to a pre-etching or a surface activating treatment by using an acidic solution.

In the stage (H), as shown in FIG. 2(b), a metal plating film 5 is formed on each remaining conductor 3A to form each electrical conductive circuit 9, which comprises the conductor 3A and the metal plating film 5 covering the surface of the conductor 3A. The metal plating film 5 may preferably be a solder film or a tin film formed by an electrolytic plating process, a solder film or a tin film formed by an electroless plating process, or a laminated film comprising a gold plating film formed on a nickel plating film. A thickness of the metal plating film 5 may preferably be 0.5 to 15 μm. Then, a plating solution may preferably be washed by a surface activating treatment and water and the flexible resistive film 1 may preferably be dried in a temperature of 40° to 100° C. Gaps 6 are formed between the electrical conductive circuits 9.

In the stage (I), an ultraviolet light curable ink is applied on the adhesive layer 2 to form an applied layer, which is dried to form a second layer 7 composed of the ink as shown in FIG. 2(c). The second layer 7 filled in the gaps 6 and also formed on the circuit 9. The ultraviolet light curable ink may preferably be a negative-type photoetching resist ink comprising a photosensitive acrylic polymer (such as polyacrylic ester) or a photosensitive epoxy polymer as its main component. An apparent specific gravity of the ultraviolet light curable ink may preferably be 0.9 to 2.0 and a viscosity thereof may preferably be 0.1 to 1000 poise. A thickness of the applied layer of the ink before drying may preferably be 10 to 80 μm. The applied layer may preferably be dried in a temperature of 20° to 80° C. for 10 minutes to 12 hours.

In the stage (J), ultraviolet light is irradiated to the second layer 7 through the flexible resistive film 1 as arrows A shown in FIG. 2(c), so that the second layer 7 is cured by the ultraviolet light in gaps 6 between the electrical conductive circuits 9. Simultaneously, because the ultraviolet light is irradiated through the film 1, the light does not pass through the electrical conductive circuits 9, so that the ink is not cured on the circuits 9.

In the stage (K), uncured portions of the second layer 7 are removed by using a developing solution so that the electrical conductive circuits 9 are exposed and the cured portions of the second layer 7 remains in the gaps 6. Then, in the stage (L), the cured portions of the second layer 7 is subjected to a heat treatment. The heat treatment may preferably be carried out in a temperature of 100° to 150° C. for 10 minutes to 3 hours in a hot-blast stove to aftercure the cured portions of the second layer 7. When the temperature is lower than 100° C., the cured portions are not thoroughly aftercured and its heat resistance may be occasionally insufficient. When the temperature is higher than 150° C., thermal shrinkage of the flexible resistive film 1 may occur during the heat treatment to degrade flexibility thereof.

After the heat treatment, as shown in FIGS. 3(b), the cured portions are aftercured to form cured films 8, which is composed of a cured product of the ultraviolet light curable ink. Consequently, as schematically shown in FIGS. 3(a) and 3(b), the gaps 6 between the electrical conductive circuits 9 of the flexible circuit board 10 is filled with the cured films 8. The resulting board 10 may be cut into articles with a desired length and width.

When using the flexible circuit board of the present invention, an anisotropic conductive membrane device or the like is inserted between terminal portions in one end portion on one side of the flexible circuit board and electrode portions of one of various electronic devices. An anisotropic conductive membrane device or the like is also inserted between terminal portions in the other end portion on said one side of the flexible circuit board and electrode portions of a print circuit board. Both end portions on said one side of the flexible circuit board is then subjected to a heat and a pressing treatment to mechanically and electrically connect the terminal portions and electrode portions.

The heat treatment may preferably be carried out in a temperature of 100° to 200° C. and the pressing treatment may preferably be carried out at a pressure of 10 to 70 kg/cm². When the temperature is lower than 100° C., the terminal portions and the electrode portions are not adhered to each other. When the temperature is higher than 200° C., the anisotropic conductive membrane device may decomposes and thermal shrinkage of the flexible resistive film 1 may occur during the heat treatment. When the pressure is lower than 10 kg/cm², the terminal portions and the electrode portions are not adhered to each other. When the pressure is higher than 70 kg/cm², the electrical conductive circuits may occasionally break out.

The present invention for producing the flexible circuit boards is described in more detail in the following examples 1 to 3.

EXAMPLE 1

An epoxy adhesive was applied onto a surface of a polyester film (a flexible resistive film) 1 with a thickness of 50 μm to form an applied layer, which was then dried in a far infrared ray furnace to form an adhesive layer 2 with a thickness of 20 μm (the stage (A)). An electrolytic copper foil 3 with a thickness of 18 μm was contacted onto the adhesive layer 2, which was subjected to a heat and pressing treatment in a temperature of 110° C. and in a pressure of 3 kg/cm so that the polyester film 1 and the copper foil 3 were adhered to each other. After this, the adhesive layer 2 was aftercured (thermal curing) in a temperature of 150° C. for 3 hours in a hot-blast stove (the stage (B)).

A surface of the copper foil 3 was polished by using a buff to obtain a polished surface, onto which an ultraviolet light curable ink was applied and dried in a temperature of 100° C. for 5 minutes to form a first layer 4 composed of the ink. The ink was a photoetching resist ink produced by mixing 25 weight % of a photosensitive epoxy polymer, 10 weight % of an acrylic ester photopolymerization initiator, 35 weight % of ethylcellosolve acetate, 15 weight % of toluene and 15 weight % of xylene and dispersing these ingredients uniformly. An apparent specific gravity of the ultraviolet light curable ink was 0.95 and a viscosity thereof was 80 poise. A thickness of the applied layer of the ink before drying was 10 μm (the stage (C)).

A negative film with a predetermined pattern was placed onto the first layer 4 and adhered thereto by using vacuum. Ultraviolet light (80 mJ/cm²) was irradiated to the first layer 4 through the negative film so that the first layer 4 was cured according to the predetermined pattern of the negative film (the stage (D)).

Uncured portions of the first layer 4 were removed by using a developing solution and washed well with water. After removing the developing solution, water remained on the exposed copper foil 3 was blow out by blowing air, and the remaining cured portions were then dried in a temperature of 85° C. for 30 minutes in a warm-blast stove (the stage (E)). The copper foil 3, which was exposed between the cured portions of the first layer 4, is subjected to an etching treatment to remove the exposed portions of the foil 3. An etching solution was then washed by water and the polyester film 1 was dried by blowing warm air of 120° C. for 5 minutes (the stage (F)).

The cured portions of the first layer 4 were removed from conductors 3A by using 5% sodium hydroxide solution. The exposed surfaces of the conductors 3A were activated by using 3% hydrochloric acid solution (the stage (G)). A solder film 5 with a thickness of 2 to 3 μm was then deposited on the surface of each conductor 3A by an electrolytic 9:1 solder plating process. The surfaces of the solder films 5 were then subjected to a surface activating treatment with sodium tertially phosphate and a plating solution was washed well by water. The flexible resistive film 1 was dried by blowing warm air of 70° C. (the stage (H)).

An ultraviolet light curable ink was then applied on the adhesive layer 2 to form an applied layer, which was dried by blowing warm air of 80° C. for 30 minutes to form a second layer 7 composed of the ink. The ink was a photo-etching resist ink produced by mixing 25 weight % of a photosensitive epoxy polymer, 10 weight % of an acrylic ester photopolymerization initiator, 35 weight % of ethylcellosolve acetate, 15 weight % of toluene and 15 weight % of xylene and dispersing these ingredients uniformly. An apparent specific gravity of the ink was 0.95 and a viscosity thereof was 100 poise. A thickness of the applied layer of the ink before drying was 20 μm (the stage (I)).

Ultraviolet light (150 mJ/cm$^2$) was irradiated to the second layer 7 through the flexible resistive film 1 so that the second layer 7 was cured by the ultraviolet light in gaps 6 between the electrical conductive circuits 9 (the stage (J)). Uncured portions of the second layer 7 were removed by using a developing solution so that the electrical conductive circuits 9 were exposed (the stage (K)).

The cured portions of the second layer 7 was then subjecting to a heat treatment in a temperature of 150° C. for 1 hour in a hot-blast stove. The resulting board 10 was cut into articles with desired lengths and widths.

An anisotropic conductive membrane device was inserted between terminal portions in one end portion on one side of the flexible circuit board 10 and electrode portions (having a pitch of 0.20 mm) of a liquid crystal display tube. Another anisotropic conductive membrane device was also inserted between terminal portions in the other end portion on said one side of the board and electrode portions of a print circuit board. Both end portions on said one side of the flexible circuit board is then subjected to a heat and a pressing treatment in a temperature of 180° C. and a pressure of 40 kg/cm$^2$ to mechanically and electrically connect the terminal portions and the electrode portions.

EXAMPLE 2

An epoxy adhesive was applied onto a surface of a polyetherimide film (a flexible resistive film) 1 with a thickness of 25 μm to form an applied layer, which was then dried in a far infrared ray furnace to form an adhesive layer 2 with a thickness of 15 μm (the stage (A)). A copper foil 3 produced by rolling with a thickness of 35 μm was contacted onto the adhesive layer 2, which was subjected to a heat and pressing treatment in a temperature of 120° C. and in a pressure of 3.5 kg/cm so that the polyetherimide film 1 and the copper foil 3 were adhered to each other. After this, the adhesive layer 2 was aftercured (thermal curing) in a temperature of 180° C. for 3 hours in a hot-blast stove (the stage (B)).

A surface of the copper foil 3 was polished by using a buff to obtain a polished surface, onto which an ultraviolet light curable ink was applied and dried in a temperature of 85° C. for 20 minutes to form a first layer 4 composed of the ink. The ink was a photoetching resist ink produced by mixing 20 weight % of a photosensitive epoxy polymer, 15 weight % of an acrylic ester photopolymerization initiator, 40 weight % of ethylcellosolve acetate, 15 weight % of toluene and 15 weight % of xylene and dispersing these ingredients uniformly. An apparent specific gravity of the ink was 0.8 and a viscosity thereof was 50 poise. A thickness of the applied layer before drying was 8 μm (the stage (C)).

A negative film with a predetermined pattern was placed onto the first layer 4 and adhered thereto by using vacuum. Ultraviolet light (50 mJ/cm$^2$) was irradiated to the first layer 4 through the negative film so that the first layer 4 was cured according to the predetermined pattern (the stage (D)).

Uncured portions of the first layer 4 were removed by using a developing solution and washed well with water. After removing the solution, water remained on the exposed copper foil 3 was blow out by blowing air and the remaining cured portions were then dried in a temperature of 100° C. for 10 minutes in a warm-blast stove (the stage (E)). The copper foil 3, which was exposed between the cured portions, is subjected to an etching treatment to remove the exposed portions of the foil 3. An etching solution was then washed by water and the polyetherimide film 1 was dried by blowing warm air of 80° C. for 10 minutes (the stage (F)).

The cured portions were removed from the conductors 3A by using 5% sodium hydroxide solution. The exposed surface of the conductors 3A was activated by using 3% hydrochloric acid solution (the stage (G)). A tin film 5 with a thickness of 0.5 to 1.0 μm was then deposited on the surface of each conductor 3A by an electroless tin plating process. The surface of the tin film 5 was then subjected to a surface activating treatment with sodium tertially phosphate and a plating solution was washed by water. The flexible resistive film 1 was dried by blowing warm air of 60° C. (the stage (H)).

An ultraviolet light curable ink was then applied on the adhesive layer 2 to form an applied layer, which was dried in a temperature of 100° C. for 1 hour. The ink was a negative-type photoetching resist ink comprising a photosensitive epoxy polymer as a main component. An apparent specific gravity of the ink was 0.95 and a viscosity thereof was 120 poise. A thickness of the applied layer before drying was 40 μm (the stage (I)).

Ultraviolet light (200 mJ/cm$^2$) was irradiated to the second layer 7 through the flexible resistive film 1 so that the second layer 7 was cured by the ultraviolet light in gaps 6 between the electrical conductive circuits 9 (the stage (J)). Uncured portions of the second layer 7 were removed by using a developing solution so that the electrical conductive circuits 9 were exposed (the stage (K)). The cured portions of the second layer 7 was then subjected to a heat treatment in a temperature of 160° C. for 3 hours in a hot-blast stove (the stage (L)). The resulting board 10 was cut into articles with desired lengths and widths.

An anisotropic conductive membrane device was inserted between terminal portions in one end portion on one side of the flexible circuit board 10 and electrode portions (having a pitch of 0.20 mm) of a liquid crystal display tube. Another anisotropic conductive membrane device was also inserted between terminal portions in the other end portion on said one side of the board and electrode portions of a print circuit board. Both end portions on said one side of the flexible circuit board is then subjected to a heat and a pressing treatment in a temperature of 190° C. and a pressure of 35 kg/cm² to mechanically and electrically connect the terminal portions and the electrode portions.

EXAMPLE 3

An epoxy adhesive was applied onto a surface of a polyimide film 1 with a thickness of 25 μm to form an applied layer, which was then dried in a far infrared ray furnace to form an adhesive layer 2 with a thickness of 10 μm (the stage (A)). An electrolytic copper foil 3 with a thickness of 8 μm was contacted onto the adhesive layer 2, which was subjected to a heat and pressing treatment in a temperature of 95° C. and in a pressure of 2.5 kg/cm so that the polyimide film 1 and the copper foil 3 were adhered to each other. After this, the adhesive layer 2 was aftercured in a temperature of 160° C. for 1 hour and in a temperature of 190° C. for 1 hour in a hot-blast stove (the stage (B)).

A surface of the copper foil 3 was polished by using a buff to obtain a polished surface, onto which an ultraviolet light curable ink was applied and dried in a temperature of 70° C. for 1 hour to form a first layer 4 composed of the ink. The ink was a photoetching resist ink produced by mixing 25 weight % of a photosensitive acrylic polymer, 10 weight % of an acrylic ester photopolymerization initiator, 40 weight % of ethylcellosolve acetate, 2 weight % of toluene, 3 weight % of xylene and 2 weight % of methylethylketone and dispersing these ingredients uniformly. An apparent specific gravity of the ink was 0.9 and a viscosity thereof was 30 poise. A thickness of the applied layer before drying was 15 μm (the stage (C)).

A negative film was placed onto the first layer 4 and adhered thereto by using vacuum. Ultraviolet light (100 mJ/cm²) was irradiated to the first layer 4 through the negative film so that the first layer 4 was cured according to the predetermined pattern of the negative film (the stage (D)).

Uncured portions of the first layer 4 were removed by using a developing solution and washed well with water. After removing the solution, water remained on the exposed copper foil 3 was blown by air and the remaining cured portions were then dried in a temperature of 60° C. for 1 hour (the stage (E)). The exposed copper foil 3 was subjected to an etching treatment. An etching solution was then washed by water and the polyimide film 1 was dried by blowing warm air of 65° C. for 30 minutes (the stage (F)).

The cured portions were removed from the conductors 3A by using 5% sodium hydroxide solution. The exposed surfaces of the conductors 3A were activated by using 3% hydrochloric acid solution (the stage (G)). A nickel plating film with a thickness of 1 μm was deposited on the surface of each conductor 3A by an electrolytic plating process and a gold plating film with a thickness of 0.3 to 0.5 μm was deposited on the nickel plating film to form a metal plating film 5. A plating solution was washed by cold water and hot water. The polyimide film 1 was dried by blowing warm air of 80° C. (the stage (H)).

An ultraviolet light curable ink was then applied on the adhesive layer 2 to form an applied layer, which was dried by blowing warm air of 65° C. for 10 minutes to form a second layer 7. The ink was a negative-type photoetching resist ink comprising a photosensitive epoxy polymer as a main component. An apparent specific gravity of the ink was 0.95 and a viscosity thereof was 100 poise. A thickness of the applied layer before drying was 10 μm (the stage (I)).

Ultraviolet light (120 mJ/cm²) was irradiated to the second layer 7 through the polyimide film 1 so that the second layer 7 was cured in gaps 6 between the electrical conductive circuits 9 (the stage (J)). Uncured portions of the second layer 7 were removed by using a developing solution so that the circuits 9 were exposed (the stage (K)). The cured portions of the second layer 7 was then subjecting to a heat treatment in a temperature of 130° C. for 30 minutes in a hot-blast stove (the stage (L)). The resulting board 10 was cut into articles with desired lengths and widths.

An anisotropic conductive membrane device was inserted between terminal portions in one end portion on one side of the flexible circuit board 10 and electrode portions (having a pitch of 0.20 mm) of a liquid crystal display tube. Another anisotropic conductive membrane device was also inserted between terminal portions in the other end portion on said one side of the board and electrode portions of a print circuit board. Both end portions on said one side of the flexible circuit board is then subjected to a heat and a pressing treatment in a temperature of 190° C. and a pressure of 35 kg/cm² to mechanically and electrically connect the terminal portions and the electrode portions.

As described above, according to the flexible circuit board of the present invention, the gaps between the electrical conductive circuits are filled with the cured films and a flat surface is formed. Therefore, when electrode portions of one of various devices are mechanically and electrically connected with terminal portions of the flexible circuit board, and when electrode portions of a print circuit board are mechanically and electrically connected with the terminal portions, it is possible to avoid the lowering of adhesive strengths between the electrode portions and the terminal portions and to maintain them over a predetermined value in a practical manufacturing process, Moreover, it is possible to prevent that conductive fine particles in an anisotropic conductive membrane device flow into the gaps to increase an electrical resistance between the electrode portions and the terminal portions.

According to the process for producing a flexible circuit board of the present invention, it is possible to fill the gaps inevitably formed between the electrical conductive circuits with cured films so that the circuits are not protruded from the cured films and a flat surface is formed. Moreover, these stages may be easily carried out by applying and modifying prior photoresist techniques and facilities without introducing new facilities. Therefore, the present invention is extremely useful in the art and may be widely used in various electronic devices such as liquid crystal display tubes, ECD's, solar cells or the like, which are used in various electrical and electronic instruments such as word processors, watches, cameras and various display devices.

The present invention has been explained referring to the preferred embodiments, however, the present invention is not limited to the illustrated embodiments which are given by way of examples only, and may be carried out in various modes without departing from the scope of the invention.

We claim:

1. A process for producing a flexible circuit board comprising the steps of:

(A) applying an adhesive onto a flexible resistive film and drying the adhesive to form an adhesive layer;

(B) contacting a metal foil onto said adhesive layer, which is subjected to a heat and pressing treatment so that said flexible resistive film and said metal foil are adhered to each other;

(C) polishing a surface of said metal foil to obtain a polished surface, onto which an ultraviolet light curable ink is applied and dried to form a first layer composed of said ultraviolet light curable ink;

(D) placing a negative film with a predetermined pattern on or over said first layer and irradiating ultraviolet light to said first layer through said negative film so that said first layer is cured according to said predetermined pattern;

(E) removing uncured portions of said first layer in the stage (D) so that cured portions of said first layer remains according to said predetermined pattern and said metal foil is exposed between said remaining cured portions;

(F) subjecting said metal foil to an etching treatment to remove the exposed portions of said metal foil between said cured portions so that unexposed portions of said metal foil under said cured portions remain to form conductors;

(G) removing said cured portions of said first layer from said conductors of metal foil;

(H) forming a metal plating film on each conductor to form each electrical conductive circuit comprising said conductor and said metal plating film covering a surface of said conductor;

(I) applying an ultraviolet light curable ink on said adhesive layer and drying said ink to form a second layer composed of said ink;

(J) irradiating ultraviolet light to said second layer through said flexible resistive film so that said second layer is cured by the ultraviolet light in gaps between said electrical conductive circuits;

(K) removing uncured portions of said second layer so that said electrical conductive circuits are exposed and cured portions of said second layer remains in said gaps;

(L) subjecting said cured portions of said second layer to a heat treatment.

2. The process for producing a flexible circuit board as claimed in claim 1, wherein, in the stage (I), said ultraviolet light curable ink is a negative type photoetching resist ink comprising one or more photosensitive polymer selected from a group consisting of a photosensitive acrylic polymer and a photosensitive epoxy polymer, as its main component, an apparent specific gravity of said ultraviolet light curable ink is 0.9 to 2.0, a viscosity thereof is 0.1 to 1000 poise, a thickness of an applied layer of said ultraviolet light curable ink is 10 to 80 µm and said ultraviolet light curable ink is dried in a temperature of 20° to 80° C. for 10 minutes to 12 hours.

3. The process for producing a flexible circuit board as claimed in claim 2, wherein, in the stage (L), said cured portions of said second layer are subjected to a heat treatment in a temperature of 100° to 150° C. for 10 minutes to 3 hours.

4. The process for producing a flexible circuit board as claimed in claim 1, wherein, in the stage (A), said flexible resistive film is made of one or more resin selected from a group consisting of a polyester resin, a polyimide resin, a polyetherimide resin, a polycarbonate resin and an aramide resin.

5. The process for producing a flexible circuit board as claimed in claim 4, wherein said adhesive layer is formed of an epoxy adhesive and a thickness of an applied layer of said adhesive before drying is 5.0 to 30.0 µm in the stage (A), and a thickness of said metal foil is 4 to 70 µm, said heat and pressing treatment is carried out in a temperature of 100° C. to 150° C. and in a pressure of 1 to 5 kg/cm and said adhesive layer is aftercured in a temperature of 80° to 180° C. for 1 to 24 hours.

6. The process for producing a flexible circuit board as claimed in claim 4, wherein, in the stage (C), said ultraviolet light curable ink is a photoetching resist ink comprising a photosensitive acrylic polymer or a photosensitive epoxy polymer as its main component, an apparent specific gravity of said ultraviolet light curable ink is 0.9 to 2.0, a viscosity thereof is 0.1 to 1000 poise, and a thickness of an applied layer of the ink before drying is 5 to 20 µm.

7. The process for producing a flexible circuit board as claimed in claim 4, wherein said cured portions of said first layer are removed from said conductors of said metal foil by washing said cured portions with a weak alkaline solution and exposed surfaces of said conductors are subjected to a surface activating treatment by using an acidic solution in the stage (G), and said metal plating film comprises one or more metal plating film selected from a group consisting of a solder plating film, a tin plating film, a nickel plating film and a gold plating film, a thickness of said metal plating film is 0.5 to 15 µm and said flexible resistive film is dried in a temperature of 40° to 100° C. after forming said metal plating film in the stage (H).

* * * * *